(12) United States Patent
Cai et al.

(10) Patent No.: US 12,342,448 B2
(45) Date of Patent: Jun. 24, 2025

(54) THREE DIMENSIONAL CIRCUIT MOUNTING STRUCTURES

(71) Applicant: NVIDIA Corp., Santa Clara, CA (US)

(72) Inventors: Joey Cai, Shenzhen (CN); Tiger Yan, Shen Zhen (CN); Zhu Hao, Shenzhen (CN); Yi Dinghai, Shenzhen (CN)

(73) Assignee: NVIDIA Corp., Santa Clara, CA (US)

( * ) Notice: Subject to any disclaimer, the term of this patent is extended or adjusted under 35 U.S.C. 154(b) by 401 days.

(21) Appl. No.: 17/723,172

(22) Filed: Apr. 18, 2022

(65) Prior Publication Data

US 2023/0337350 A1      Oct. 19, 2023

(51) Int. Cl.
  H05K 1/02       (2006.01)

(52) U.S. Cl.
  CPC .  H05K 1/0203 (2013.01); *H05K 2201/09227* (2013.01); *H05K 2201/10734* (2013.01)

(58) Field of Classification Search
  CPC ....... H01L 25/065; H01L 23/00; H01L 25/00; H01L 23/49816; H01L 23/5383; H01L 23/13; H01L 23/367; H05K 1/0203; H05K 2201/09227; H05K 2201/10734; H05K 3/301; H05K 2201/047; H05K 2201/10606
  See application file for complete search history.

(56) References Cited

U.S. PATENT DOCUMENTS

| | | | |
|---|---|---|---|
| 5,602,059 A | * | 2/1997 | Horiuchi ................. H01L 24/86 29/841 |
| 6,122,171 A | | 9/2000 | Akram et al. |
| 6,563,712 B2 | | 5/2003 | Akram et al. |
| 6,847,010 B1 | | 1/2005 | Hsieh et al. |
| 6,954,360 B2 | | 10/2005 | Nurminen |
| 7,257,511 B1 | | 8/2007 | Hsieh et al. |
| 7,851,267 B2 | | 12/2010 | Specht et al. |
| 8,531,032 B2 | | 9/2013 | Yu et al. |
| 9,041,229 B1 | | 5/2015 | Johnson |
| 9,530,715 B2 | | 12/2016 | Yu et al. |
| 2007/0096333 A1 | | 5/2007 | Motamedi et al. |
| 2015/0279760 A1 | * | 10/2015 | Miyawaki ............... H01L 23/13 438/106 |

FOREIGN PATENT DOCUMENTS

KR      20050059178      * 12/2006      ............. H05K 1/189

* cited by examiner

*Primary Examiner* — Timothy J Thompson
*Assistant Examiner* — Paramita Ghosh
(74) *Attorney, Agent, or Firm* — Carnelian Law, LLC

(57)      ABSTRACT

A circuit board includes chip die mounted on a three dimensional rectangular structure, a three dimensional triangular prism structure, or a combination thereof. A ball grid array for the chip die mounted on any such three dimensional structure is interposed between the three dimensional structure and the circuit board itself.

20 Claims, 4 Drawing Sheets

THREE DIMENSIONAL CIRCUIT MOUNTING STRUCTURES

BACKGROUND

A focus of advanced circuit designs is improving chip packaging processes and increasing circuit density per unit area. Traditional chip packaging processes utilize a two-dimensional (2D) layout on the mounting surface. This traditional layout approach has shortcomings such as limits on the number of transistors per unit area and problematic the heat dissipation.

FIG. 1 depicts a traditional 2D chip package layout with ball grid arrays. A chip package 102 is mounted on and interfaced to a base board 104 (e.g., a printed circuit board) via a ball grid array 106. Heating of the chip package 102 is controlled using a heat sink 108 mounted atop the chip package 102, such that a structure of horizontal layers of heat sink 108, chip package 102, ball grid array 106, and base board 104 is formed. Heat is dissipated primarily from the top of the chip package 102 through the heat sink 108. Heat may become trapped and build up between the chip package 102 and the base board 104, causing excessive heating in the region of the ball grid array 106.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 2B illustrates an aspect of the subject matter in accordance with one embodiment.

DETAILED DESCRIPTION

In one embodiment a high density die chip package layout utilizes a triangular prism mounting structure. In another embodiment a high density die chip package layout utilizes a rectangular (box) mounting structure. The substrate base board thickness is extended beyond traditional thicknesses, forming a three-dimensional (3D) layout structure. Chip packages may be mounted on opposing sides of the structure (e.g., left and right sides for the prism, or top and four sides for the rectangle). Novel internal trace routes for these structures are also utilized. The extended mounting structures enable higher transistors density per unit area and improve heat dissipation from the chip packages.

Figure 1:
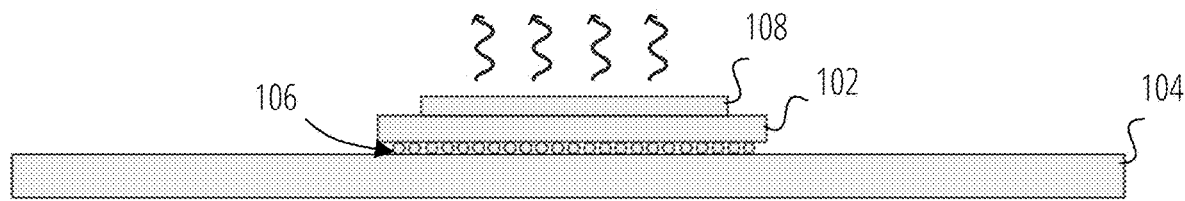
FIG. 1 depicts a traditional 2D chip package layout with ball grid arrays.
Figure 2A:
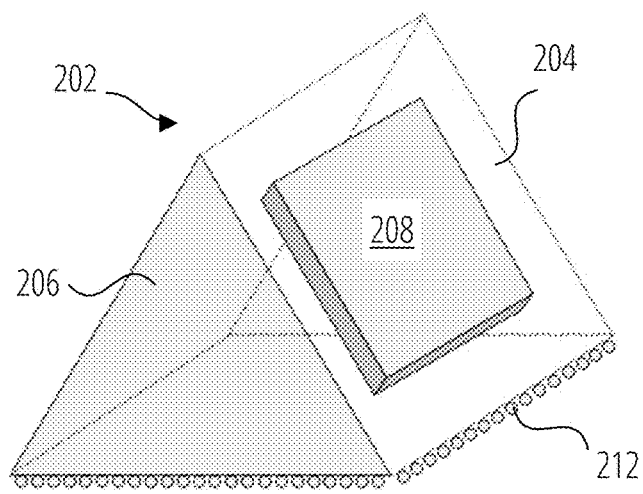
FIG. 2A and FIG. 2B depict a triangular prism mounting structure 202 in one embodiment.
Figure 2B:
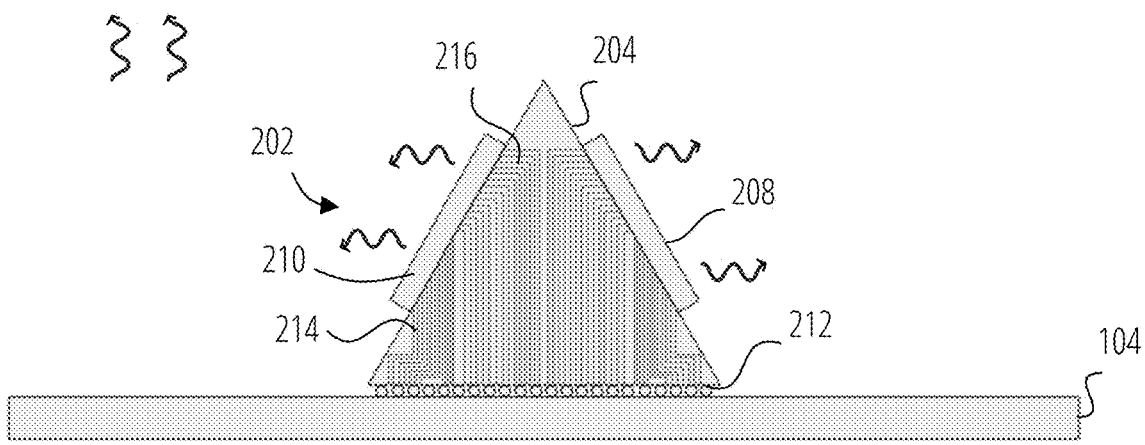

FIG. 2A and FIG. 2B depict a triangular prism mounting structure 202 in one embodiment. The prism mounting structure 202 comprises angled faces 204, vertical faces 206. In this depiction a chip die 208 and a chip die 210 are mounted on the angled faces 204; additional chip die may be mounted on the vertical faces 206, or only on the vertical faces 206, or on any combination of the angled faces 204 and vertical faces 206.

The prism mounting structure 202 is mounted to, and interfaces with, a base board 104 via a ball grid array 212 on a bottom face. The chip die 210, 208 are connected to the ball grid array 212 via shorter trace routes 214 and longer trace routes 216. The longer trace routes 216 in the depicted embodiment utilize a single right angle turn, and some of the shorter trace routes 214 utilize two right angle turns. The trace routes 214, 216 may have a uniform inter-route separation on horizontal runs and a uniform inter-route separation on vertical runs. Some of the trace routes 214 may also drop linearly to the ball grid array 212 from the chip die 210 without comprising turns. Any chip die mounted on the vertical faces 206 (not depicted) may utilize trace routes with a single right angle turn, or no turns, and (though not necessarily) uniform inter-route separation for the horizontal runs, the vertical runs, or both. In some embodiments some or all of the trace routes 216 and trace routes 214 may drop linearly without turns down to the ball grid array 212, depending on the layout of the terminals of the chip die. The particular trace routing utilized, and whether turns are utilized or not and in what number, will vary according to the size of the chip die, number of terminals on the chip die, spacing thereof, spacing and layout of the ball grid array 212, and potentially other factors as well (e.g., isolation, etc.).

In some cases the trace routes may traverse directly between terminals of chip die on the same or different faces of the prism mounting structure 202 rather than through the ball grid array 212.

Heat dissipation may be improved for such embodiment utilizing various novel heat sink implementations (see for example FIG. 4A-FIG. 4C) that encompass multiple surfaces of the prism mounting structure 202. An additional benefit is avoiding a substantial build up of heat in the region of the ball grid array 212.

Figure 3A:
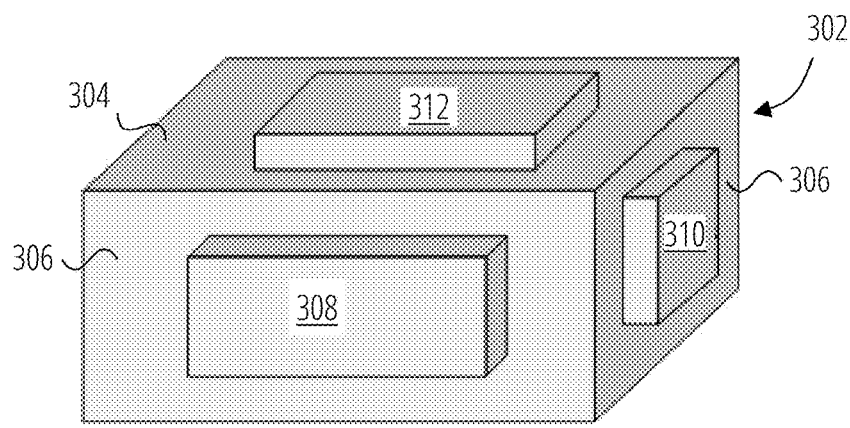
FIG. 3A and FIG. 3B depict a solid rectangular mounting structure 302 in one embodiment, comprising a top face 304 and four side faces 306.
Figure 3B:
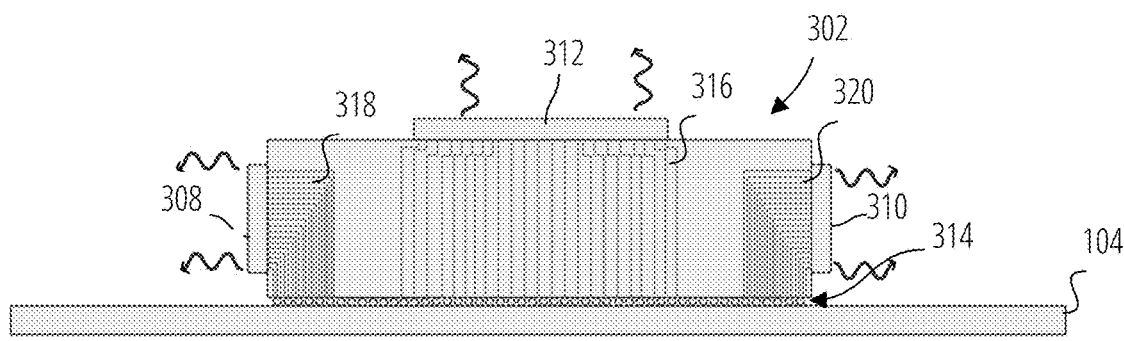

FIG. 3A and FIG. 3B depict a solid rectangular mounting structure 302 in one embodiment, comprising a top face 304 and four side faces 306. In this depiction chip die 308, 310 are mounted on the side faces 306 and a chip die 312 is mounted on the top face 304. Generally chip die may be mounted on any combination of the top face 304 and side faces 306.

The rectangular mounting structure 302 is mounted, to and interfaces with, a base board 104 via a ball grid array 314 on a bottom face. In this depiction the various chip die are connected to the ball grid array 314 via various trace routes. The chip die 312 on the top face 304 utilizes trace routes 316, some of which have two right-angle turns and others that are straight without turns, and the vertical runs of which have substantially uniform spacing. The chip die 308 on one of the side faces 306 utilizes trace routes 318 with a single right angle turn, and uniform spacing on the horizontal runs and on the vertical runs. Likewise the chip die 310 on another of the side faces 306 utilizes trace routes 320 with a single right angle turn, and uniform spacing on the horizontal runs and on the vertical runs.

In some cases the trace routes may traverse directly between terminals of chip die on the same or different faces of the rectangular mounting structure 302 rather than through the ball grid array 314.

Figure 5A:
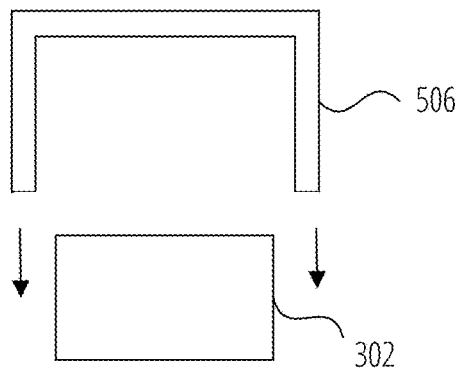
FIG. 5A-FIG. 5C depict embodiments of a heat sink for chip die mounted on a rectangular mounting structure 302 or rectangular mounting structure 322.
Figure 5B:
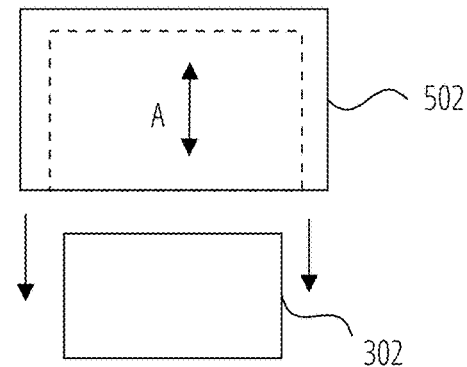
Figure 5C:
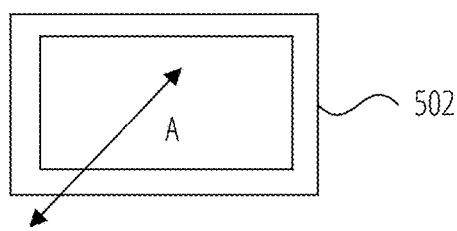

Heat dissipation may be improved for such embodiment utilizing various novel heat sink implementations (see for example FIG. 5A-FIG. 5C that encompass multiple surfaces of the rectangular mounting structure 302. An additional benefit is avoiding a substantial build up of heat in the region of the ball grid array 314.

Figure 3C:
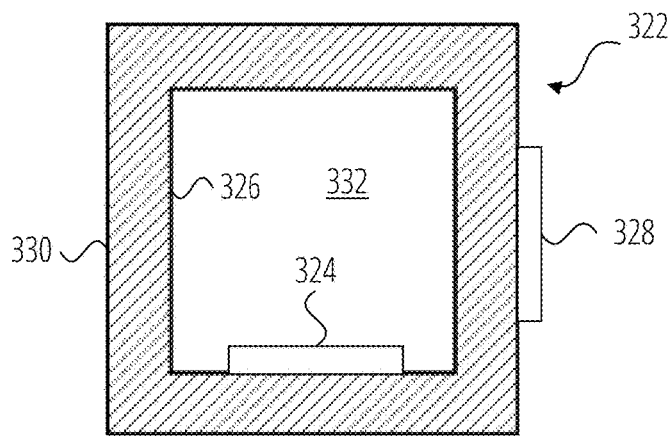
FIG. 3C depicts a hollow rectangular mounting structure 322 in another embodiment.

FIG. 3C depicts a hollow rectangular mounting structure 322 in another embodiment. In this embodiment one or more chip die 324 may be mounted on an inner surface 326 of the rectangular mounting structure 322, and one or more chip die 328 may be mounted on an outer surface 330 of the rectangular mounting structure 322. Chip die may also be mounted in the bottom region 332, which may be open or closed (part of the rectangular mounting structure 322). Heat dissipation may be improved for such embodiment utilizing various novel heat sink implementations (see for example FIG. 5A-FIG. 5D that encompass multiple inner and/or outer surfaces of the rectangular mounting structure 322. An additional benefit is avoiding a substantial build up of heat in the region of the ball grid array 314.

Figure 4A:
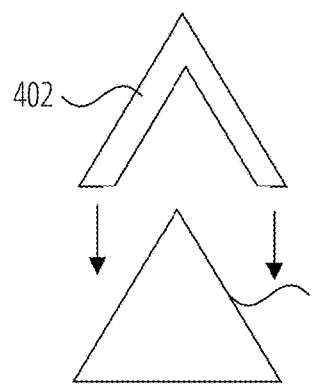
FIG. 4A-FIG. 4C depict embodiments of a heat sink for chip die mounted on a prism mounting structure 202.
Figure 4B:
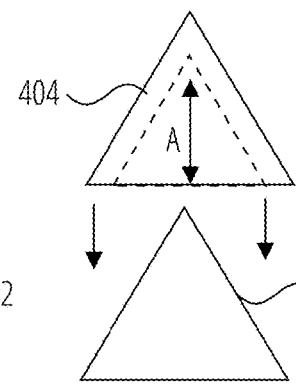
Figure 4C:
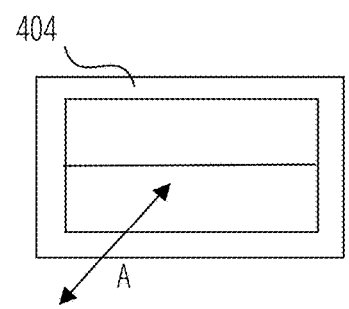

FIG. 4A-FIG. 4C depict embodiments of a heat sink for chip die mounted on a prism mounting structure 202. The heat sink 402 embodiment of FIG. 4A encompasses chip die mounted on two sides of the prism mounting structure 202, and is open on two sides. One or both of the open sides could be closed, as for example in the heat sink 404 depicted in FIG. 4B and FIG. 4C with all four sides enclosed. Generally, the heat sink embodiments for prism mounting structures may comprise two to four sides in any continuous (connected) formation.

FIG. 5A-FIG. 5C depict embodiments of a heat sink for chip die mounted on a rectangular mounting structure 302 or rectangular mounting structure 322. The heat sink 402 embodiment of FIG. 5A encompasses chip die mounted on two sides and the top of the rectangular mounting structure 302, and is open on two sides. One or both of the open sides could be closed, as for example in the heat sink 502 depicted in FIG. 5B and FIG. 5C with all four sides enclosed. Generally, these embodiments may comprise two to five sides (including the top side) in any continuous formation.

Figure 5D:
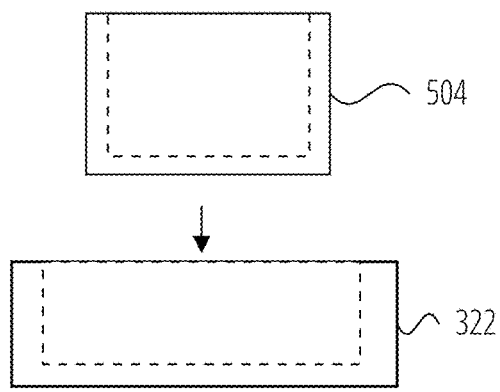
FIG. 5D depicts an embodiment of a heat sink 504 for use with chip die mounted on an inner surface 326 of a rectangular mounting structure 322.

FIG. 5D depicts an embodiment of a heat sink 504 for use with chip die mounted on an inner surface 326 of a rectangular mounting structure 322. Generally, these embodiments may comprise two to five sides (including the bottom side) in any continuous formation.

Figure 6:
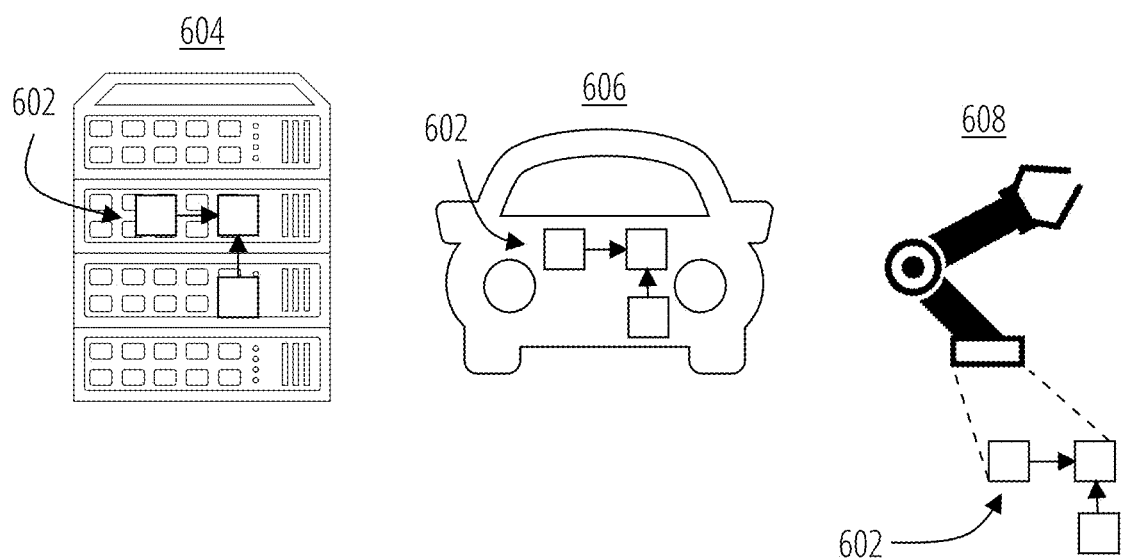
FIG. 6 depicts a circuit board 602 in accordance with one embodiment.

FIG. 6 depicts exemplary scenarios for use of a circuit board 602 utilizing embodiments of the disclosed 3D chip mounting structures. Such a circuit board 602 may be utilized in a computing system 604, a vehicle 606, and a robot 608, to name just a few examples. The circuit board 602 may comprise a chips mounted on one or more embodiments of a prism and/or rectangular 3D structure.

LISTING OF DRAWING ELEMENTS 102 chip package
104 base board
106 ball grid array
108 heat sink
202 prism mounting structure
204 angled face
206 vertical face
208 chip die
210 chip die
212 ball grid array
214 trace routes
216 trace routes
302 rectangular mounting structure
304 top face
306 side face
308 chip die
310 chip die
312 chip die
314 ball grid array
316 trace routes
318 trace routes
320 trace routes
322 rectangular mounting structure
324 chip die
326 inner surface
328 chip die
330 outer surface
332 bottom region
402 heat sink
404 heat sink
406
502 heat sink
504 heat sink
506
602 circuit board
604 computing system
606 vehicle
608 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to"

perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112 (f) for that claim element. Accordingly, claims in this application that do not otherwise include the "means for" [performing a function] construct should not be interpreted under 35 U.S.C § 112 (f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit board comprising:
   a plurality of chip die mounted on two or more sides of a three dimensional triangular prism structure;
   a ball grid array for the chip die interposed between the triangular prism structure and the circuit board; and
   a heat sink encompassing two or more sides of the triangular prism structure.

2. The circuit board of claim 1, wherein the chip die are mounted on two parallel opposite sides of the triangular prism structure.

3. The circuit board of claim 1, wherein the heat sink encompasses two adjacent sides of the triangular prism structure where the chip die are mounted.

4. The circuit board of claim 1, wherein the chip die are mounted on more than two sides of the triangular prism structure.

5. The circuit board of claim 4, wherein the heat sink encompasses four sides of the triangular prism structure.

6. The circuit board of claim 1, further comprising:
   longer trace routes between the chip die and the ball grid array consisting of a single right angle turn; and
   shorter trace routes between the chip die and the ball grid array consisting of two right angle turns.

7. The circuit board of claim 6, further comprising:
   trace routes between the chip die and the ball grid array that do not comprise turns.

8. A circuit board manufacturing process comprising:
   mounting a plurality of chip die on two or more sides of a three dimensional triangular prism structure;
   interposing a ball grid array for the chip die between the triangular prism structure and the circuit board; and
   disposing a unitary heat sink that encompasses the chip die.

9. The circuit board manufacturing process of claim 8, wherein the chip die are mounted on opposite parallel sides of the triangular prism structure.

10. The circuit board manufacturing process of claim 8, wherein the chip die are mounted on adjacent sides of the triangular prism structure.

11. The circuit board manufacturing process of claim 8, wherein the chip die are mounted on more than two sides of the triangular prism structure.

12. The circuit board manufacturing process of claim 11, wherein the unitary heat sink is disposed on at least three sides of the triangular prism structure.

13. A circuit board comprising:
   a plurality of chip die mounted on two adjacent sides of a three dimensional triangular prism structure;

a ball grid array for the chip die interposed between the triangular prism structure and the circuit board; and a heat sink encompassing the two adjacent sides of the triangular prism structure.

14. An apparatus comprising:
a plurality of chip die mounted on two or more sides of a three dimensional triangular prism structure;
a ball grid array for the chip die disposed on a base of the triangular prism structure; and
a heat sink encompassing two or more sides of the triangular prism structure.

15. The apparatus of claim 14, wherein the chip die are mounted on two parallel opposite sides of the triangular prism structure.

16. The apparatus of claim 14, wherein the heat sink encompasses two adjacent sides of the triangular prism structure where the chip die are mounted.

17. The apparatus of claim 14, wherein the chip die are mounted on more than two sides of the triangular prism structure.

18. The apparatus of claim 17, wherein the heat sink encompasses four sides of the triangular prism structure.

19. The apparatus of claim 14, further comprising:
longer trace routes between the chip die and the ball grid array consisting of a single right angle turn; and
shorter trace routes between the chip die and the ball grid array consisting of two right angle turns.

20. The apparatus of claim 19, further comprising:
trace routes between the chip die and the ball grid array that do not comprise turns.

\* \* \* \* \*